(12) United States Patent
Eisele et al.

(10) Patent No.: US 9,308,650 B2
(45) Date of Patent: Apr. 12, 2016

(54) GRIPPER APPARATUS

(71) Applicant: J. Schmalz GmbH, Glatten (DE)

(72) Inventors: Thomas Eisele, Alpirsbach-Peterzell (DE); Aline Defranceski, Stuttgart (DE)

(73) Assignee: J. SCHMALZ GMBH, Glatten (DE)

( * ) Notice: Subject to any disclaimer, the term of this patent is extended or adjusted under 35 U.S.C. 154(b) by 0 days.

(21) Appl. No.: 14/423,569

(22) PCT Filed: Aug. 21, 2013

(86) PCT No.: PCT/EP2013/067364
§ 371 (c)(1),
(2) Date: Feb. 24, 2015

(87) PCT Pub. No.: WO2014/033021
PCT Pub. Date: Mar. 6, 2014

(65) Prior Publication Data
US 2015/0298320 A1    Oct. 22, 2015

(30) Foreign Application Priority Data
Aug. 31, 2012  (DE) .......................... 10 2012 215 513

(51) Int. Cl.
*A47J 45/00* (2006.01)
*B25J 15/00* (2006.01)
(Continued)

(52) U.S. Cl.
CPC .......... *B25J 15/0085* (2013.01); *B25J 15/0066* (2013.01); *B25J 15/0071* (2013.01); *B25J 15/06* (2013.01); *H01L 21/6831* (2013.01); *H01L 21/6838* (2013.01)

(58) Field of Classification Search
CPC .... B25J 15/0085; B25J 15/0071; B25J 15/06; B25J 15/0066; B25J 15/0616; H01L 21/6831; H01L 21/6838; H01L 21/68707; C23C 16/4585; H01J 37/32082; H02N 13/00; B25B 11/007; B65G 47/91

USPC ................................................... 361/230, 234
See application file for complete search history.

(56) References Cited

U.S. PATENT DOCUMENTS

| 5,729,423 A | 3/1998 | Donde et al. |
| 6,676,761 B2 * | 1/2004 | Shang ............... H01L 21/68742 118/715 |

(Continued)

FOREIGN PATENT DOCUMENTS

| DE | 10319272 A1 | 11/2004 |
| DE | 102005013904 A1 | 10/2005 |

(Continued)

OTHER PUBLICATIONS

Jun. 24, 2013 German Examination Report for German Patent Application No. 10 2012 215 513.9.
(Continued)

*Primary Examiner* — Stephen Vu
(74) *Attorney, Agent, or Firm* — Howard & Howard Attorneys PLLC

(57) ABSTRACT

A gripper apparatus includes a receiving surface which faces an object for gripping purposes, and includes at least one electroadhesion section, which has at least one electrode, for exerting an electroadhesion force on the object. In order to reliably grip and hold an object, provision is made for the electroadhesion section for bearing against the object to be gripped to project beyond the receiving surface in the direction of the object which is to be gripped in such a way that a space which adjoins the receiving surface and the electroadhesion section is formed, and that the electroadhesion section is designed such that it can be deformed in such a way that it can be matched to the shape of the object which is to be gripped when it bears against said object.

11 Claims, 3 Drawing Sheets

(51) Int. Cl.
*B25J 15/06* (2006.01)
*H01L 21/683* (2006.01)

(56) References Cited

U.S. PATENT DOCUMENTS

| | | | |
|---|---|---|---|
| 8,652,260 B2 * | 2/2014 | Yu | H01L 21/67103 |
| | | | 118/725 |
| 8,967,081 B2 * | 3/2015 | Borean | C23C 16/45565 |
| | | | 118/723 E |
| 2006/0005771 A1 * | 1/2006 | White | C23C 16/4583 |
| | | | 118/728 |
| 2011/0110010 A1 | 5/2011 | Pelrine et al. | |
| 2011/0193362 A1 | 8/2011 | Prahlad et al. | |

FOREIGN PATENT DOCUMENTS

| | | |
|---|---|---|
| DE | 102004045447 A1 | 3/2006 |
| EP | 1473764 A2 | 11/2004 |
| JP | 5129421 A | 5/1993 |
| WO | 2007143662 A2 | 12/2007 |

OTHER PUBLICATIONS

Feb. 20, 2014 International Search Report for PCT/EP2013/067364.

* cited by examiner

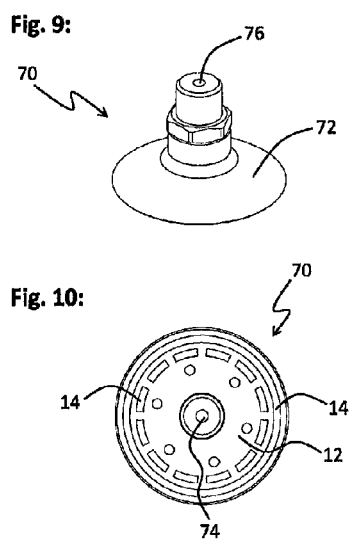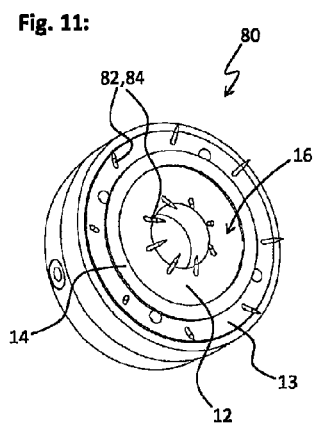

GRIPPER APPARATUS

CROSS-REFERENCE TO RELATED APPLICATION

This application is the U.S. National Stage entry of international application PCT/EP2013/067364, filed on Aug. 21, 2013, which in turn is based upon and claims priority to German Patent Application No. 102012215513.9, filed on Aug. 31, 2012.

BACKGROUND OF THE INVENTION

1. Field of the Invention

The present invention relates, generally, to a gripper apparatus and, more specifically, to an electroadhesive gripper apparatus.

2. Description of the Related Art

Gripper apparatuses can use the principle of electroadhesion in order to exert a retention force on an object that is to be gripped or retained. For this a static electric potential in particular is applied to at least one electrode of an electroadhesive gripper apparatus. As a result, a static electric field, in particular, is generated. If the electrodes of an electroadhesive gripper apparatus are positioned in the proximity of the surface of an object that is to be gripped, an electroadhesive force can be exerted by the gripper apparatus on the object to be gripped via the electric field.

There is the problem thereby that the functional range of the electroadhesion force around the electrode is very small. Thus, in order to be able to reliably grip and retain an object, the spacing between the surface of the object that is to be gripped and the electrodes should be very small. For this reason, mainly electroadhesive gripper apparatuses for manipulating flat components, such as semiconductor wafers for example, are described in the prior art.

In particular, a gripping and retaining of uneven objects is problematic. Due to the limited range of the electroadhesion force, picking up objects is also problematic if the electroadhesive gripper apparatus cannot be placed directly on the object that is to be gripped. An electroadhesive gripper apparatus exhibits in this regard only a limited penetration. A step height can only be attained with difficulty. For this reason, it is difficult to make a targeted selection from numerous objects arranged adjacent to one another, or to only pick up specific objects. Furthermore, the described gripper apparatuses are only suited to a limited extent for separating objects in a collection of numerous objects. Lastly, the releasing of an object from the electroadhesive gripper apparatus can also be problematic, because, for example, with non-conductive objects, and electrostatic charge may occur.

An electroadhesive gripper apparatus is described in US 2011/0110010 A1, which has a flat extending, but flexibly bendable, gripper surface, in which electric sections are incorporated for exerting an electroadhesion force.

A multi-function carrier, in particular for a gripper, is described in DE 103 19 272 A1. The multi-function carrier has a flat carrier substrate, serving as a bearing surface. Electric sections for exerting an electroadhesion force on an adjoining object are provided in the plane of the carrier substrate. Furthermore, flow-through openings for a Bernoulli suction device and for other vacuum retaining apparatuses are provided in the bearing plane. The multi-function carrier serves to affix flat workpieces, such as semiconductor wafers, for the manipulation thereof, wherein, to a certain extent, curvatures in the flat workpieces can be compensated for. For this, the workpiece that is to be affixed with a comparably strong suction force by the Bernoulli suction device are suctioned onto the bearing surface and brought into the effective range of the electrodes for exerting an electroadhesion force. Larger surface irregularities cannot, however, be compensated for.

SUMMARY OF THE INVENTION

The present invention overcomes the disadvantages in the related art by which objects with uneven surface contours can be reliably and securely gripped and retained. In particular, it should be possible to pick up individual objects in a targeted way, or to separate objects in a collection of different objects.

This object is achieved by a gripper apparatus having a receiving surface, which can be turned to face an object in order to grip it, as well as at least one electroadhesion section for exerting an electroadhesion force on the object. The electroadhesion section has at least one electrode for generating an electric field.

As set forth in one embodiment, the gripper apparatus includes wherein the electroadhesion section protrudes over the receiving surface, toward the object to be gripped, in order to be brought to bear on the object that is to be gripped, such that a free space can be formed, bordering the receiving surface and the electroadhesion section. Furthermore, the electroadhesion section is malleable, such that its shape can be adapted to the object that is to be gripped, or to its surface contour, when placed thereon.

This design also makes it possible to securely retain objects with surface structures or uneven objects at the electroadhesion section. The electroadhesion section is designed, in particular, such that when it is brought to bear on the object it can be compressed toward the receiving surface. For this it is not necessary that the entire gripper surface be designed as a flexible component, as is the case with the prior art specified in the introduction. The receiving surface of the inventive gripper apparatus does not need to be designed such that it can adapt to shapes. Instead, the receiving surface can be rigid, as a part of a housing or carrier section of the gripper apparatus, for example. This allows for a stable and compact structure of the gripper apparatus.

As a result, objects can be retained that, due to their surface quality for example, cannot be retained with suction grippers (having perforated surfaces, for example), or that are not magnetic.

The inventive gripper apparatus also enables, advantageously, the integration of additional gripper principles. In addition, in particular, a gripper or a gripper device for exerting a gripping force, which is functionally independent of electroadhesion, can be integrated in the free space. The gripper or the gripper device can be disposed, e.g. in the free space on the receiving surface, or can include this space, as will be explained by way of example in the following. The additional gripper or gripper device make it possible to exert greater forces with the inventive gripper apparatus than would be possible using only electroadhesion.

Furthermore, a force can be exerted on the object that is to be gripped with the additional gripper or the additional gripper device, such that this object ends up in close contact with the electroadhesion section, and a shaping of the electroadhesion section occurs in order to adapt to the surface structure of the object. This elasticity of the electroadhesion section is advantageously adjusted to the retaining force that can be exerted with the additional gripper device in the direction of the receiving surface, such that a shaping and adapting of the electroadhesion section occurs.

When the object rests against the electroadhesion section, a strong electroadhesion force can be exerted. The gripper apparatus can be designed, in particular, such that after picking up the object a retaining of the object is achieved exclusively by the electroadhesion force, i.e. the potential additional gripper or gripper devices are deactivated. This makes it possible to place the object retained in this way in a vacuum environment, for example, in which a retaining of the object by a vacuum would no longer be possible. Furthermore, by deactivating the additional gripper device, the power efficiency is increased, and nevertheless, the workpiece is retained in a precise position by the electroadhesive gripper apparatus.

The receiving surface is designed to be flat in particular, in a gripper plate for a surface gripper, for example. A curved surface of the receiving surface, in a contact surface for a suction gripper, for example, is also conceivable, however.

An electroadhesive force can be generated by the electroadhesion section in line with the principles explained in the introduction. The electroadhesion section can adapt its shape insofar as it can adapt to the contours of the surface of the object that is to be gripped, in order to enable an effective initiation of the electroadhesion force. The electroadhesion section, in particular, is elastic. Advantageously, it is designed to be soft, such that a form-fitting with sections of the surface of the object that is to be gripped can be obtained. A design made of an elastomer or a flexible, in particular elastic, foam, such as a plastic foam, for example, is conceivable. The electroadhesion section is designed such that it runs on the receiving surface, in particular, in a ridge or a strip.

In order to generate the electric field, the malleable electroadhesion section includes at least one electrode. This electrode itself is designed such that it can be shaped, in particular, by way of example, as a thin metal layer. The electrode can also be formed as a carrier material having conductive particles, e.g. carbon nano-tubes. The conductive particles can be incorporated in the electroadhesion section, or attached to the carrier material. The electrode can be incorporated in the electroadhesion section, i.e. it can run in the interior thereof. It is, however, also conceivable that the electrode runs on a surface of the electroadhesion section facing the object to be gripped. An insulating layer can be applied to the electrode.

One design of the gripper apparatus is that at least one additional gripper device is provided, that is functionally independent of the electroadhesion. This can be disposed on a section of the receiving surface bordering the free space. The additional gripper device is designed, in particular, as a suction gripper, Bernoulli gripper, magnetic gripper, in particular with a magnet that can be activated, or a needle gripper. The additional gripper device is designed such that a retaining force and/or gripping force can be exerted on the object to be gripped in the direction of the receiving surface. This makes it possible to attract objects at a greater distance to the receiving surface. Thus, a step height can be attained by a suitable additional gripper device. In particular, a Bernoulli gripper can exhibit a greater penetration.

A combination of an electroadhesive gripper device and a magnetic gripper device with a magnet that can be activated is, for example, advantageous for the manipulation of sheets, in particular for the cutting thereof. Cut out sheet pieces can be removed selectively from the remaining sheet by the magnetic gripper device, and pressed onto the electroadhesion section by the magnetic force. When the electroadhesive retaining force is functioning, the magnetic gripper device can be deactivated.

With the use of a vacuum gripper as the additional gripper device, a leakage can be reduced by the adaption of the electroadhesion section when placed on the object. For this, it is particularly advantageous when the electroadhesion section is designed such that it is soft, so that a form-fitting to sections of the surface of the object to be gripped can be obtained.

If a needle gripper is used as the additional gripper device, then due to the effective additional electroadhesion force, a reduced penetration of the needles is needed, reducing the structural space necessary for needle gripper, for example.

A retaining of the object by the electroadhesion section enables in an advantageous way a detection of whether an object is picked up with the gripper apparatus. This is based on the effect that the electrical characteristics of the electroadhesion section can change when an object is resting against it. In particular it is possible to detect, by the electrical characteristics of the electroadhesion section, whether a potential additional gripper device of the gripper apparatus has gripped an object and attracts this object to the electroadhesion section.

The at least one electroadhesion section, or the individual electrodes of an electroadhesion section as well, can advantageously be switched on and off, and/or be activated such that the gripping effect can be activated and deactivated, or the magnitude of the electroadhesion force can be controlled. For this, the gripper apparatus can include a device for controlling the electrical potential on the electrodes of the electroadhesion section. Advantageously, various electroadhesion sections and/or various electrodes of an electroadhesion section can be switched on and off, or can be electrically activated, independently of one another. These designs enable a controlled picking up and releasing of objects.

A releasing device for exerting a releasing force in order to release a retained object from the electroadhesion section may be provided. The releasing device is, for example, disposed in the free space or at one of the sections of the receiving surface bordering the free space. It is also conceivable, however, that the releasing device is provided on the electroadhesion section. The releasing force can, for example, be exerted mechanically, by a push rod that can be displaced. Advantageously, this push rod can be retracted and extended in a direction perpendicular to the receiving surface, and in particular, is disposed in the free space. The releasing can, however, also occur by a blow-off operation. For this, the releasing device can include at least one blow hole, which is disposed, in particular in the receiving surface, and advantageously, in the free space.

The electroadhesion section can entirely encompass the free space in directions following the receiving surface, e.g., such that a circular or rectangular bordered free space is defined. As a result, a free space that can be sealed off can be provided on a surface of the object that is to be gripped by the electroadhesion section bearing thereon.

On the other hand, it may be advantageous when the electroadhesion section does not border the free space such that it fully encompasses it. By way of example, numerous electroadhesion sections that mesh with one another can be provided, which extend, in particular, over an angle on the receiving surface.

One embodiment of the invention is obtained in that the receiving surface is disposed on an, in particular, elastic suction cup of a suction gripper. The suction cup delimits a suction chamber that can be evacuated with its receiving surface when placed on the object that is to be gripped. The suction cup is designed, e.g. such that it resembles a bell. The suction chamber is connected electrically to a vacuum path, e.g. a vacuum channel. The vacuum path extends, e.g. through the suction cup in the direction facing away from the receiving surface, and opens, for example, into a vacuum connection of the gripper apparatus.

The electroadhesion section can be designed as a sealing lip that can be placed and sealed against an object that is to be gripped.

In order to create an electroadhesion section that can be adapted to the surface of an object, the electroadhesion section can include a filling space encompassed by malleable walls. The filling space is filled, in particular, with a granulate, an electrorheological fluid, or a magnetorheological fluid. A filling thereof with a gas, e.g. air, is also conceivable, however.

In a further design, the gripper apparatus can have a device for solidifying the filling in the specified filling space. By way of example, a filling space filled with a granulate can be designed such that it can be evacuated, for which a controllable evacuation device can be provided for the filling space. When evacuated, the air between the granular matter can be removed, and the filling is thus solidified. If the filling space is filled, for example, with an electrorheological fluid or magnetorheological fluid, then a device may be provided for introducing an electric or magnetic field into the fluid. As a result, the electrorheological fluid, or the magnetorheological fluid, respectively, can be solidified.

A convenient repair or maintenance of the gripper apparatus is enabled in that the at least one electroadhesive section is disposed on the receiving surface such that it can be attached and released. As a result, a replacement of the electroadhesion section is possible, when, for example, the elasticity of the material of the electroadhesion section changes due to aging. With a break in the contact of the electrodes, or individual sections, the electroadhesion section can be replaced.

The gripper apparatus advantageously has numerous separate electroadhesion sections, which can be activated and deactivated independently for exerting an electroadhesion force, meaning they can be subjected to an electrical potential independently of one another. This enables a targeted picking up and a targeted releasing of individual objects.

Advantageously, the numerous electroadhesion sections are disposed such that the receiving surface is subdivided into numerous retaining zones. Further advantageously, a free space is allocated thereby to each retaining zone, which borders on at least one of the electroadhesion sections allocated to the respective retaining zone. With a gripper apparatus of this type, objects can be separated. Advantageously, each retaining zone has an additional gripper device allocated to it, as described above. In the embodiment, the gripper devices of the various retaining zones can, in turn, be activated and deactivated independently of one another, in order to grip an object. The individual gripper devices are advantageously disposed in the respective allocated free spaces, as explained above.

If, for example, different magnetic gripper devices, in particular magnetic gripper devices that can be activated independently, are allocated to different free spaces, then different cut-out sheet pieces, for example, can be selectively removed from the remaining sheet. It is conceivable that the receiving surface is large enough that when it is used in a sheet cutting facility, it can be placed on a sheet in which a plurality of sheet pieces are cut out. When the various retaining zones and/or the various magnetic gripper devices allocated thereto are designed such that they can be activated and deactivated independently of one another, then the respective sheet pieces bearing on a retaining zone can be gripped in a targeted way, and independently of other sheet pieces, and can be retained and put down separately. Sheet pieces lying in the interior of the remaining sheet, or residual pieces that result when, for example, a ring is cut out, can thus be separated from the remaining pieces in a targeted way. When the retaining zones are designed in a suitable way, then it is also possible to grip and separate very small sheets and sheet pieces.

With all of the designs of the inventive gripper apparatus, different electrical potentials, deviating from one another, can be applied to different electroadhesion sections. It is conceivable, in particular, that respective adjacent electroadhesion sections can be charged with opposite polarities. In particular, each electroadhesion section can have a plurality of electrodes, which can exhibit differing potentials. In one embodiment, adjacent electroadhesion sections or adjacent electrodes of an electroadhesion section have potentials of opposite polarities (a bipolar or multi-polar design). A unipolar design is also conceivable, however, in particular having identical potentials. In one embodiment, a voltage is applied between respective adjacent electroadhesion sections. The voltage can be applied statically in each case, over time periods. The use of an alternating voltage, however, is also conceivable.

As a further design, the gripper apparatus can be designed such that a controllable current can be conducted via at least one electrode of an electroadhesive section. For this, the gripper apparatus has, in particular, a current conducting device, e.g. a wiring for the electrode and a control device, with which a controllable current supply can be provided.

As a result, a magnetic field having a variable size and polarity can be obtained. This can serve to exert a supplementary retaining force on, for example, magnetic or magnetizable objects. Conversely, the variable magnetic field can be used in order to repel a magnetic object in a targeted way, and thus to release the object from the electroadhesion sections. The gripper apparatus can, in particular, have an electronic control device for applying a potential, by at least one electrode of an electroadhesion section, that can vary over time, and to generate a current flow that can vary over time, such that an electromagnetic alternating field can be generated.

The electrodes can also be designed such that a targeted heating of the electrode and the electroadhesion section can be obtained by at least one of the electrodes by a controllable current. This is advantageous when retained pieces are to be heated, or a handling thereof in a warm state is to occur. This can, e.g. be desired in the manipulation of textile semi-finished products, where the operation time for treatments can be reduced by melting the binders during the handling thereof. The specified design is also advantageous in the handling of so-called organic sheets, which can only be shaped in a heated state (in particular considerably warmer than room temperature), and with which, therefore, a cooling during the operation thereof, and in particular during the handling, is to be avoided.

In order to achieve the object established in the introduction, a plurality of the described gripper apparatuses can also be integrated in a gripper system. The various gripper apparatuses are then advantageously disposed such that the various receiving surfaces lie in a virtual plane. In order to enable a flexible gripping, a configuration of the various receiving surfaces in planes differing from one another may, however, also be advantageous. It may be advantageous, in particular, when the various gripper apparatuses are disposed such that they can move independently of one another.

BRIEF DESCRIPTION OF THE DRAWINGS

Other objects, features, and advantages of the present invention will be readily appreciated as the same becomes better understood after reading the subsequent description taken in connection with the accompanying drawing wherein:

FIG. 9 shows a side view of an inventive gripper apparatus with a suction gripper.

FIG. 10 shows a bottom view of the inventive gripper apparatus with a suction gripper.

FIG. 11 shows an inventive gripper apparatus with a needle gripper.

DETAILED DESCRIPTION OF THE INVENTION

In the following description the same reference symbols are used for identical components or components corresponding to one another. With reference now to the drawings, in FIGS. 1 and 2 a gripper apparatus 10 for retaining and gripping an object 2 is depicted schematically. The object 2 exhibits an uneven surface contour.

Figure 1:
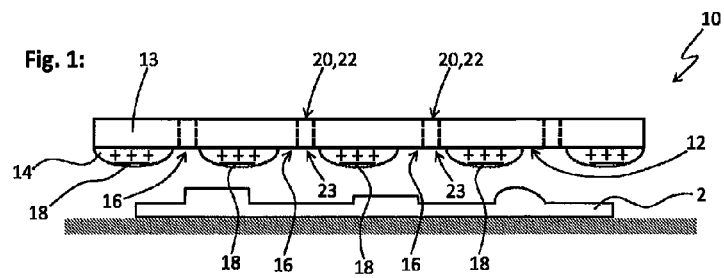
FIG. 1 shows a side view of an inventive gripper apparatus in a unipolar design.
Figure 2:
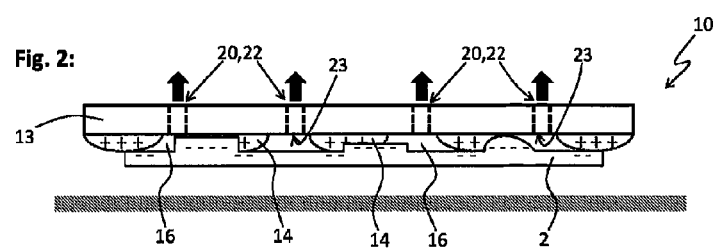
FIG. 2 shows a side view of the inventive gripper apparatus in a unipolar design.
Figure 3:
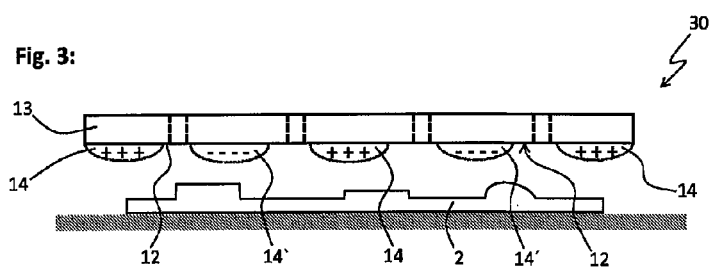
FIG. 3 shows a side view of an inventive gripper apparatus in a bipolar design.
Figure 4:
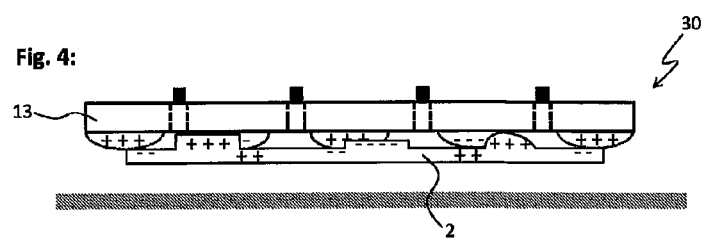
FIG. 4 shows a side view of the inventive gripper apparatus in a bipolar design.

The gripper apparatus 10 includes a receiving surface 12, which faces an object 2 that is to be gripped. FIGS. 1 and 2 (as well as FIGS. 3 to 6) show the gripper apparatus in a sectional depiction perpendicular to the receiving surface 12. The receiving surface 12 is advantageously disposed in a carrier section 13 of the gripper apparatus 10. In the depicted example the receiving surface 12 is designed to be flat.

Numerous electroadhesion sections 14 are provided in the receiving surface 12. These serve to bear on the object 2 that is to be gripped, and extend over the receiving surface 12 toward the object 2 that is to be gripped, such that in each case, a free space 16 is formed, bordered by a section of the receiving surface 12 and at least one electroadhesion section 14.

Each electroadhesion section 14 is designed to exert an electroadhesion force on the object 2. For this, each electroadhesion section 14 includes at least one electrode 18, by which an electric, in particular an electrostatic, field can be generated. The electrode 18 is advantageously embedded in a section of the electroadhesion section 14 facing the object 2. It can, however, also be applied to a surface of the electroadhesion section 14, in particular facing the object 2 that is to be gripped, and covered by an insulating layer, for example.

Each electroadhesion section 14, and also, in particular, the electrode 18 included therein, is designed such that it can be deformed. As a result, the respective electroadhesion section 14 can adapt to the surface contour of the object 2 when brought to bear thereon, as is depicted in FIG. 2.

The gripper apparatus 10 also has a plurality of additional gripper devices 20, which are functionally independent of the electroadhesion sections 14. The additional gripper devices 20 are designed as suction grippers 22 in the depicted example, each of which have a suction opening 23 opening into a free space 16 in the receiving surface 12. With a suitable design of the electroadhesion section 14, each free space 16 can thus serve as the suction chamber for the respective suction gripper 22, which can be evacuated through the suction opening 23. The suction chamber can then be sealed off by the respective bordering electroadhesion sections 14, when these electroadhesion sections are brought to bear on the object 2 that is to be gripped. A sealing application is obtained, in particular, in that the electroadhesion sections 14 can adapt to the surface contour of the object 2 (cf. FIG. 2).

The object 2 can be reliably and securely retained with the gripper apparatus 10. On one hand, it is possible for the gripper apparatus 10 to approach the object 2, and to push the receiving surface 12 toward the object 2 such that the electroadhesion sections 14 come to bear on the object 2, and adapt to the surface contour of the object 2 by a deformation of the electroadhesion sections. In this way, the spacing between the field generating electrodes 18 and the object 2 is small enough that a large electroadhesion force is generated.

It is, however, also possible that the object 2, starting from the position and orientation thereof depicted in FIG. 1, is first suctioned toward the receiving surface 12 by the suction gripper 22, and then comes to bear on the electroadhesion sections 14. By the bearing on the electroadhesion sections 14 and the possible shaping of the electroadhesion sections 14 to adapt to the surface of the object 2, the electroadhesion force can then be great enough to retain the object 2 exclusively by the electroadhesion sections 14. It is then possible to deactivate the additional gripper device 20.

The electroadhesion force acting between the electroadhesion sections 14 and the object 2 can also serve to obtain a closer bearing of the electroadhesion sections 14 on the surface 2, and thus an improved sealing of the free space 15 on the surface of the object 2. This makes it possible to exert a large suction force by the suction gripper 22 by evacuating the respective free space 16. The electroadhesion sections 14 serve, in this regard, as sealing lips for a suction chamber of a suction gripper 22. The actual retaining force acting on the object 2 is then applied, not by the electroadhesion force, but rather by the vacuum in the respective free space 16.

A unipolar embodiment of the electroadhesion force is illustrated in FIGS. 1 and 2. All of the electroadhesion sections 14 are connected to a positive electrostatic potential.

For some applications it may be advantageous to implement the electroadhesion force in a bipolar embodiment, wherein the receiving surface 12 exhibits electroadhesion sections 14, on one hand, which are connected to a positive electrical potential. On the other hand, electroadhesion sections 14' are provided, which are subjected to a different, in particular lower, electrical potential.

Figure 5:
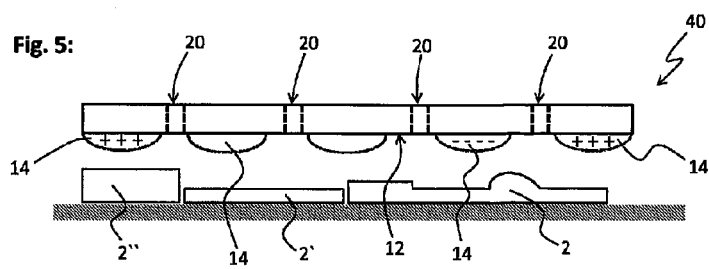
FIG. 5 shows a side view of an inventive gripper apparatus for separating objects.
Figure 6:
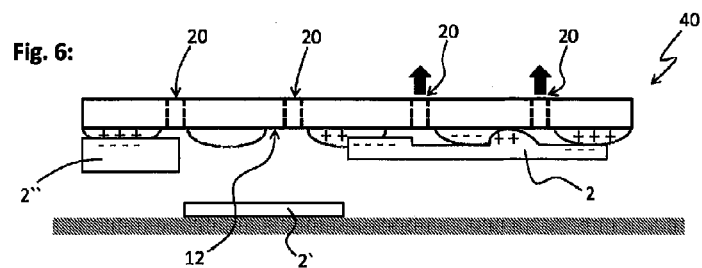
FIG. 6 shows a side view of the inventive gripper apparatus for separating objects.

The gripper apparatus 40 illustrated in FIGS. 5 and 6 is designed such that is substantially corresponds to the gripper apparatuses 10 and 30. The various electroadhesion sections 14, however, can be activated and deactivated independently of one another thereby, for exerting an electroadhesion force. For this, the gripper apparatus 40 exhibits an electrical control. With the gripper apparatus 40, the additional gripper devices 20 (suction gripper 22) can likewise be activated and deactivated independently of one another, for exerting a gripping force, or a retaining force, respectively, on the object 2. This makes it possible to grip, in an isolated way, using the gripper apparatus 40, individual objects from a collection of the objects indicated with the numerals 2, 2', and 2" in FIGS. 5 and 6. The gripper apparatus 40 can thus be used to separate objects.

Figure 7:
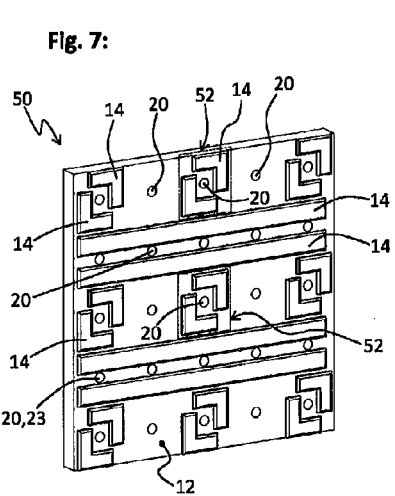
FIG. 7 shows a bottom view of one embodiment of an inventive gripper apparatus.

FIG. 7 an inventive gripper apparatus 15 designed as a surface gripper is depicted in a perspective looking at the receiving surface 12.

The gripper apparatus 50 includes a plurality of separately designed electroadhesion sections 14, which extend over the receiving surface 12 as described above. The electroadhesion surfaces 14 run, in part extended longitudinally along a straight line, on the receiving surface 12. Furthermore, electroadhesion sections 14 are provided, which extend over an angle, in the shape of an L, on the receiving surface 12. Further gripper devices 20 are disposed, in turn, on the receiving surface 12, which, e.g. can be designed as suction grippers with suction openings 23 opening onto the receiving surface 12. Numerous retaining zones 52 are defined on the receiving surface 12, in each case by two L-shaped electroadhesion sections 14, which lie opposite one another with respect to another gripper device 20.

Figure 8:
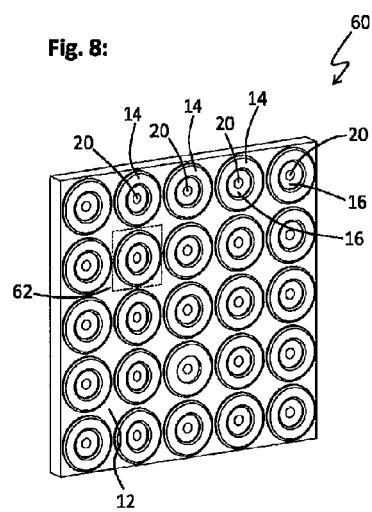
FIG. 8 shows a bottom view of a further embodiment of an inventive gripper apparatus.

In FIG. 8 an inventive gripper apparatus 60 is depicted in turn, in a depiction with a view of the receiving surface 12. The gripper apparatus 60 has a plurality of annular electroadhesion sections 14, each having the same design. Each of the annular electroadhesion sections 14 entirely encompasses a free space 16 in the direction following the flat receiving surface 12. In each of the free spaces 16 enclosed in this way, a further gripper device 20 (e.g. a suction gripper) is disposed on the receiving surface 12.

One retaining zone 62 is defined by each annular electroadhesion section 14 on the receiving surface 12. The electroadhesion sections 14 are disposed in a matrix on the receiving surface 12, such that this receiving surface is subdivided into retaining zones 62 disposed in a matrix. Advantageously, the electroadhesion sections 14 and the additional gripper devices 20 for each retaining zone 52, or 62, respectively, can be activated and deactivated independently.

An inventive gripper apparatus 70 is shown in FIGS. 9 and 10, which as a whole is designed as a suction gripper. The gripper apparatus 17 includes a flexible suction cup 72, designed as a bell. The suction cup 72 is designed such that it can be brought to bear on an object that is to be gripped, and delimits a suction chamber therewith, which can be evacuated in order to pick up the object. For this, the suction chamber is electrically connected via a vacuum path 74 (cf. FIG. 10), which extends through the suction cup 72, to a vacuum connection 76 (cf. FIG. 9).

With the gripper apparatus 70, the surface of the suction cup 72 bordering the suction chamber forms the receiving surface 12 of the gripper apparatus 70. FIG. 10 shows the gripper apparatus 70 in a depiction with a view looking at the receiving surface 12. In the case of the gripper apparatus 70, the receiving surface 12 is not flat, but rather is curved as a bell. Elastically deformable electroadhesion sections 14 are disposed in turn on the receiving surface 12, which extend over the receiving surface 12 toward the object that is to be gripped. It is advantageous, in particular, when an electroadhesion section 14 runs annularly along the radial edge region of the bell-like receiving surface 12 of the suction cup 72. As a result, an improved sealing of the suction chamber can be obtained.

FIG. 11 shows a gripper apparatus 80. This exhibits a flat receiving surface 12, formed by a rigid carrier section 13. This receiving surface exhibits breaks, through which gripper needles 82 of a needle gripper device 84 can be displaced back and forth over the receiving surface 12. In the depicted example, an annular, elastically deformable electroadhesion section 14 is disposed on the receiving surface 12. This encompasses a free space 16, in which gripper needles 82 are disposed. Furthermore, additional moveable gripper needles 82 of the needle gripper device 84 in the gripper apparatus 80 are provided in a region of the receiving surface 12 lying radially outside of the free space 16.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

What is claimed is:

1. A gripper apparatus for gripping and retaining objects, the gripper apparatus comprising: a receiving surface, which is used for gripping an object, and an electroadhesive gripper device having a plurality of separate electroadhesion sections, which can be activated and deactivated independently of one another wherein said separate electroadhesion sections have at least one electrode and having a shape, for exerting an electroadhesion force on the object, wherein the at least one electroadhesion section extends over the receiving surface toward the object that is to be gripped in order to be brought to bear on the object that is to be gripped, such that a free space bordering the receiving surface and the electroadhesion section is formed, and wherein the at least one electroadhesion section is configured such that the at least one electroadhesion section can be deformed, such that when the at least one electroadhesion section is brought to bear on the object that is to be gripped, the shape can be adapted to the object.

2. The gripper apparatus as set forth in claim 1, wherein a least one additional gripper device is provided, independent of the electroadhesion, which is disposed on a section of the receiving surface bordering the free space, wherein the additional gripper device is a suction gripper, Bernoulli gripper, magnetic gripper, or needle gripper.

3. The gripper apparatus as set forth in claim 1, wherein a releasing device is disposed on a section of the receiving surface bordering the free space, the releasing device configured for exerting a releasing force in order to release a retained object from the electroadhesion section.

4. The gripper apparatus as set forth in claim 1, wherein the at least one electroadhesion section entirely encompasses the free space in a direction following the receiving surface.

5. The gripper apparatus as set forth in claim 1, wherein the receiving surface is disposed on a suction cup of a suction gripper.

6. The gripper apparatus as set forth in claim 5, wherein the at least one electroadhesion section is a sealing lip, such that a suction chamber of the suction cup can be sealed when brought to bear on the object.

7. The gripper apparatus as set forth in claim 1, wherein the at least one electroadhesion section comprises a filling space encompassed by a plurality of malleable walls, wherein the filling space is filled with a granulate, an electrorheological fluid, or a magnetorheological fluid.

8. The gripper apparatus as set forth in claim 1, wherein the at least one electroadhesion section is disposed on the receiving surface such that the at least electroadhesion section is releasably attached.

9. The gripper apparatus as set forth in claim 1, wherein the plurality of separate at least one electroadhesion sections are disposed such that the receiving surface is subdivided into a plurality of retaining zones, wherein a respective free space is allocated to each of the plurality of retaining zones, which borders on a respective at least one electroadhesive section allocated to the respective retaining zone.

10. The gripper apparatus as set forth in claim 1, wherein the gripper apparatus further comprises a controllable current conducted by the at least one electrode of the at least one electroadhesion section.

11. The gripper apparatus as set forth in claim 10, wherein the at least one electroadhesion section is heated by the controllable current conducted by the at least one electrode of the at least one electroadhesion section.

\* \* \* \* \*